(12) United States Patent
Yoon

(10) Patent No.: US 7,282,758 B2
(45) Date of Patent: Oct. 16, 2007

(54) METHOD OF FABRICATING A FLOATING GATE FOR A NONVOLATILE MEMORY

(75) Inventor: Chul Jin Yoon, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/317,363

(22) Filed: Dec. 23, 2005

(65) Prior Publication Data

US 2006/0138525 A1 Jun. 29, 2006

(30) Foreign Application Priority Data

Dec. 27, 2004 (KR) .................. 10-2004-0113257

(51) Int. Cl.
*H01L 29/788* (2006.01)
*H01L 21/336* (2006.01)
(52) U.S. Cl. .............. 257/315; 257/317; 257/E29.129; 438/260
(58) Field of Classification Search ................ 257/315, 257/317; 438/260
See application file for complete search history.

(56) References Cited

U.S. PATENT DOCUMENTS 5,879,992 A * 3/1999 Hsieh et al. ............... 438/264

\* cited by examiner

*Primary Examiner*—Evan Pert
(74) *Attorney, Agent, or Firm*—Andrew D. Fortney

(57) ABSTRACT

A method of fabricating a gate structure (such as a floating gate) of a nonvolatile (e.g., flash) memory is described. After a polysilicon layer and a mask layer (e.g., silicon nitride) are formed on a semiconductor substrate, the silicon nitride layer is patterned and the polysilicon layer is partially etched. Then, a sidewall spacer is formed on sidewalls of the partially etched polysilicon layer and the patterned mask layer. The partially etched polysilicon layer is then fully etched, maintaining a partially etched shape at its top edge due to the sidewall spacer. The mask layer and the sidewall spacer are removed, to form a floating gate having a near-round edge shape. After full etching, the polysilicon layer may be heat-treated such that its top edge shape may become more rounded, fluent and/or stress- and/or strain-relieving.

20 Claims, 6 Drawing Sheets

METHOD OF FABRICATING A FLOATING GATE FOR A NONVOLATILE MEMORY

CROSS REFERENCE TO RELATED APPLICATIONS

This U.S. non-provisional application claims priority under 35 U.S.C. §119 from Korean Patent Application No. 2004-113257, which was filed in the Korean Intellectual Property Office on Dec. 27, 2004, the contents of which are incorporated by reference herein in its entirety.

BACKGROUND OF THE INVENTION

1. Field of the Invention

The present invention relates generally to non-volatile memory technology and, more particularly, to a method of fabricating a floating gate of a non-volatile (e.g., flash) memory.

2. Description of the Related Art

In general, semiconductor memory devices may be classified into volatile memories that lose their contents (e.g., data) when power is turned off, and non-volatile memories that retain their contents (e.g., data) when power is turned off. Flash memory, a dominant type of non-volatile memory device, is widely used today for handheld devices, mobile and digital appliances, etc.

Flash memory stores data by trapping electrons from a semiconductor substrate in or on a floating gate when a voltage is applied to a control gate. Such a flash memory generally benefits from a high coupling ratio, which depends upon capacitance and/or the ability of the floating gate to store charge. In order to increase the capacitance of the floating gate, some approaches have been suggested in the art. One approach is to form an ONO (oxide-nitride-oxide) dielectric layer structure overlying, or as, the floating gate. Another approach is to form hemi-spherical grains on a surface of the floating gate. A third approach is to maximize the area of the floating gate.

Among them, the third approach may be unfavorable since it may limit any reduction in space between adjacent floating gates. The following is a description of a conventional technique for reducing space between adjacent floating gates.

FIG. 1 shows a layout of a floating gate of a conventional flash memory. FIG. 2 is a cross-sectional view taken along the line II-II of FIG. 1. Referring to FIGS. 1 and 2, a semiconductor substrate 100 has an active region 101 defined by a non-active isolation region 102. A plurality of floating gates 110 are formed at specific locations of the semiconductor substrate 100, being spaced apart from each other. As depicted in FIG. 2, a space (a) between the adjacent floating gates 110 restricts an increase in a width (b) of the floating gate.

FIGS. 3A to 3D show sequentially, in cross-sectional views, a conventional method of forming the floating gate.

Referring to FIG. 3A, a tunnel oxide layer 120, a polysilicon layer 130, and a silicon nitride layer 140 are formed in sequence on an upper surface of the semiconductor substrate 100 including the isolation region 102.

Referring to FIG. 3B, the silicon nitride layer 140 is selectively etched after performing a typical photolithographic process to pattern the silicon nitride layer 140.

FIG. 3C shows a step of forming the floating gate. In this step, the polysilicon layer (130 in FIG. 3B) is selectively etched using the patterned silicon nitride layer 140 as a hard mask. In result, the polysilicon layer 130 is patterned, exposing a surface of the isolation region 102, and therefore creating the floating gates 110.

FIG. 3D shows a step of forming a dielectric layer and a control gate. A dielectric layer such as an ONO layer 150 is formed on the floating gate 110. Then, a conductive material is deposited on the ONO layer 150 and patterned to form the control gate 160. Alternatively, polysilicon layer 130, dielectric layer 150 and a material for the control gate (not shown, but which may include, e.g., polysilicon) may be sequentially deposited, patterned and etched to form a structure such as that shown in FIG. 3D.

In the above-discussed conventional method, the floating gate 110 partly overlaps the isolation region 102 to reduce a space (indicated by a reference character "a" in FIG. 3C) between the adjacent floating gates 110. Furthermore, an overlap between the floating gate 110 and the isolation region 102 causes a sharp edge, as indicated by a reference character "A" in FIG. 3C, of the floating gate 110. Unfortunately, this shape of the floating gate 110 may deteriorate the reliability of the dielectric layer 150 overlying the floating gate 110. That is, the dielectric layer 150 may be under a lot of stress when a strong electric field is applied to the control gate 160 during operation of the flash memory. Therefore, the dielectric layer 150 may have a poor quality near edges, and further, this may have an adverse effect upon the state of electron storage and/or retention in the floating gate. Because of this, the flash memory may operate wrong.

SUMMARY OF THE INVENTION

Exemplary, non-limiting embodiments of the present invention provide a method for fabricating a floating gate of a nonvolatile (e.g., flash) memory so as to enhance its reliability.

According to one exemplary embodiment of the present invention, the method comprises forming in sequence a tunnel oxide layer, a polysilicon layer, and a mask (e.g., silicon nitride) layer on a semiconductor substrate having an isolation region, patterning the mask layer and partially etching the polysilicon layer (e.g., the polysilicon layer exposed through the mask pattern), forming a sidewall spacer on sidewalls of the partially etched polysilicon layer as well as sidewalls of the patterned mask layer, fully etching the polysilicon layer using the sidewall spacer and the patterned mask, and removing the patterned mask layer and the sidewall spacer. In the present method, the fully etched polysilicon layer maintains a partially etched shape at its top edge due to the sidewall spacer. Also, after removing the mask pattern and the sidewall spacer, the remaining polysilicon layer forms a floating gate generally imparting lower stress and/or strain on an overlying dielectric and/or having a near-round edge shape.

The method of the present invention may further comprise heat-treating the polysilicon layer after fully etching the polysilicon layer such that the top edge shape of the polysilicon layer becomes more rounded and/or fluent, and/or imparts less stress and/or strain on an overlying dielectric.

In the method of this invention, fully etching the polysilicon layer may comprise a dry etching process. In this case, the method may further comprise performing a heat treatment process using oxygen gas (e.g., heating in the presence of an oxygen source) after the dry etching process.

Additionally, forming the sidewall spacer may include depositing a second mask (e.g., silicon nitride) layer and then anisotropically etching the second mask layer. Also, removing the patterned mask layer and the sidewall spacer may comprise treating the patterned mask layer and the sidewall spacer with phosphoric acid.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention may, however, be embodied in many different forms and should not be construed as limited to the exemplary embodiment set forth herein. Rather, the disclosed embodiment is provided to more fully convey the scope of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures may not be drawn to scale. Rather, for simplicity and clarity of illustration, the dimensions of some of the elements may be exaggerated relative to other elements.

FIGS. 4A to 4E are cross-sectional views showing in sequence a method for fabricating a floating gate of a nonvolatile (e.g., flash) memory in accordance with an exemplary embodiment of the present invention.

Figure 1:
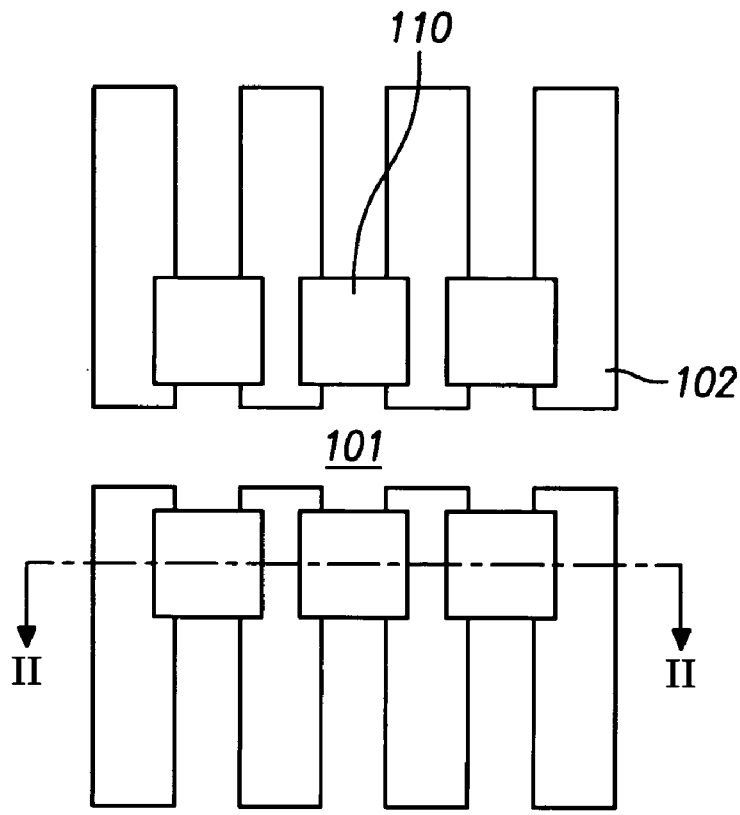
FIG. 1 shows a layout of a floating gate of a conventional flash memory.
Figure 2:
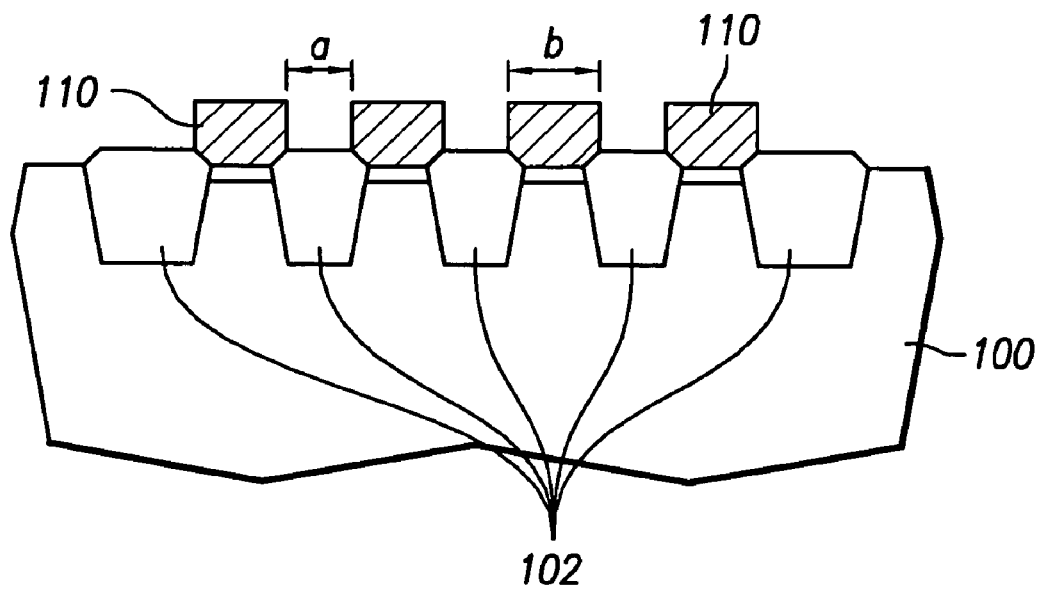
FIG. 2 is a cross-sectional view taken along the line II-II of FIG. 1.
Figure 3A:
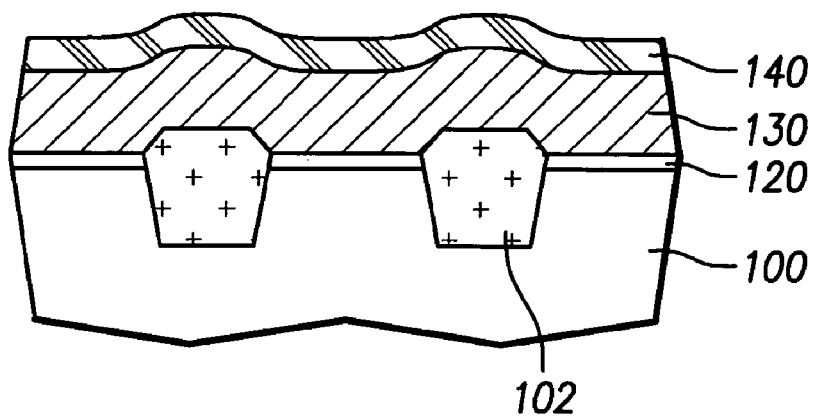
FIGS. 3A to 3D are cross-sectional views showing in sequence a conventional method for fabricating a floating gate of a nonvolatile (e.g., flash) memory.
Figure 3B:
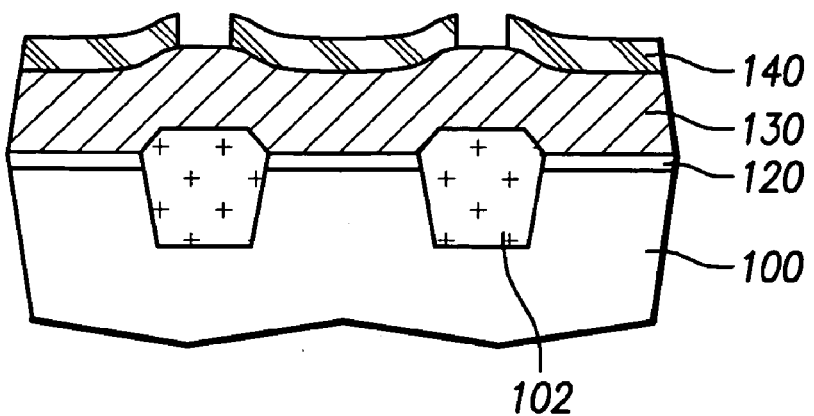
Figure 3C:
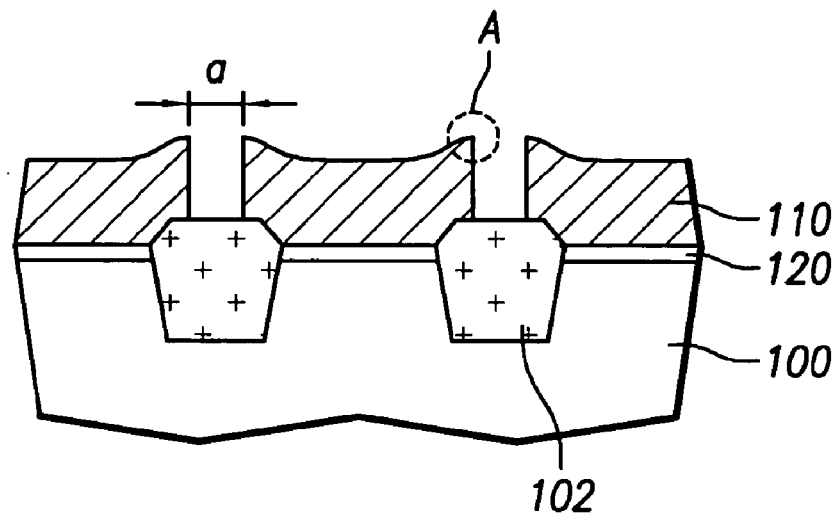
Figure 3D:
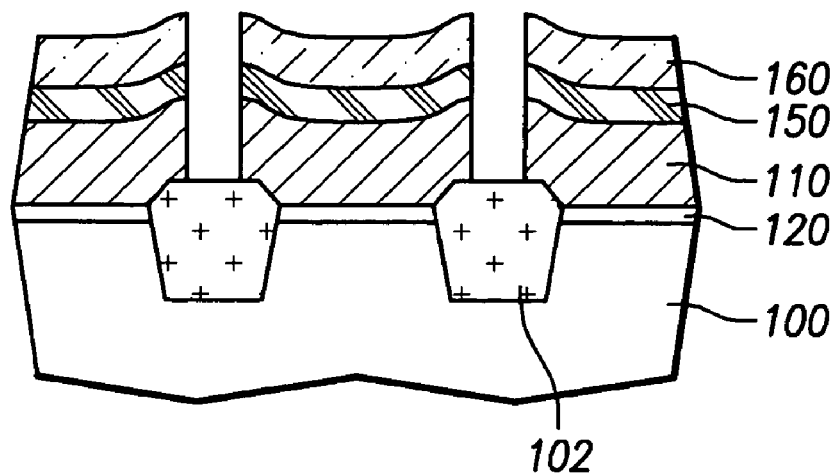
Figure 4A:
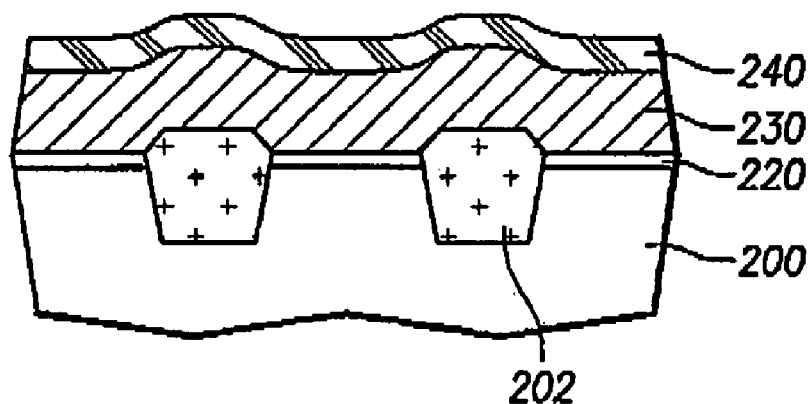
FIGS. 4A to 4E are cross-sectional views showing in sequence a method for fabricating a floating gate of a nonvolatile (e.g., flash) memory in accordance with an exemplary embodiment of the present invention.

Referring to FIG. 4A, a tunnel oxide layer 220, a polysilicon layer 230 to be used as the floating gate, and a first silicon nitride layer 240 are formed in sequence on an upper surface of a semiconductor substrate 200 in which a plurality of isolation regions 202 are (selectively) formed.

Figure 4B:
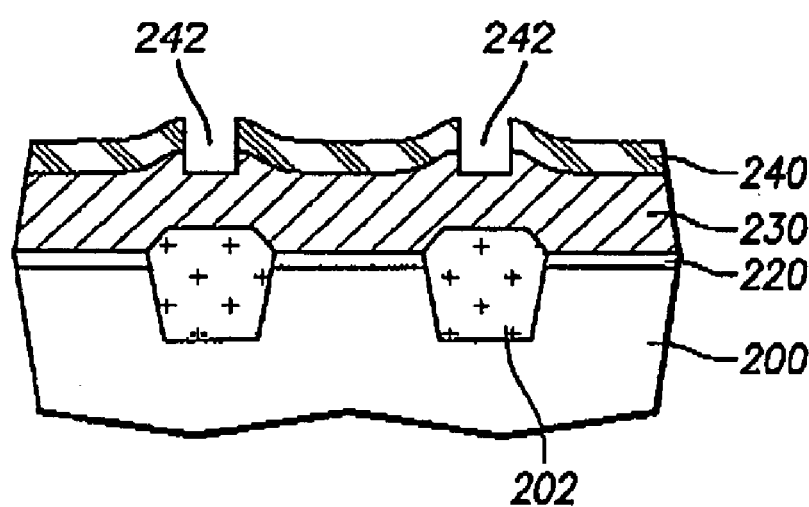

Referring to FIG. 4B, the first mask layer 240 (typically comprising an insulator such as silicon dioxide, silicon oxynitride or silicon nitride, preferably silicon nitride) is selectively etched by performing a typical photolithography, developing and etching process to form a mask pattern 242. In a typical flash memory architecture, mask pattern 242 generally has a long axis in the direction of the bit lines. So patterns 242 of the mask layer 240 are produced, being spaced apart from each other.

Particularly, in this etching step, the polysilicon layer 230 is also partially etched from the top thereof. Partial removal of the polysilicon layer 230 may result from slightly incomplete or relatively low etch selectivity (e.g., from about 2:1 to about 10:1; for example, about 3:1 to about 5:1). This combined mask layer/polysilicon etch may be implemented by a timed etch (e.g., etching the mask layer 240 and the polysilicon layer 230 for a predetermined length of time, in a single process without breaking vacuum of the etch chamber). Plasma etch conditions and chemistries providing such selectivity may be determined empirically and/or in accordance with techniques and/or approaches known to those skilled in the art. The depth of the partial etch into the polysilicon layer 230 may be from about 5% to about 50% (preferably from about 10% to about 35%) of the thickness of the polysilicon layer 230. To isolate the floating gate, a second etching step may be performed in the direction of the flash memory word lines, e.g., as discussed herein with regard to FIG. 4D. Alternatively, the mask patterns 242 may be formed in a single step in both the bit line and the word line directions in the nonvolatile memory architecture.

Figure 4C:
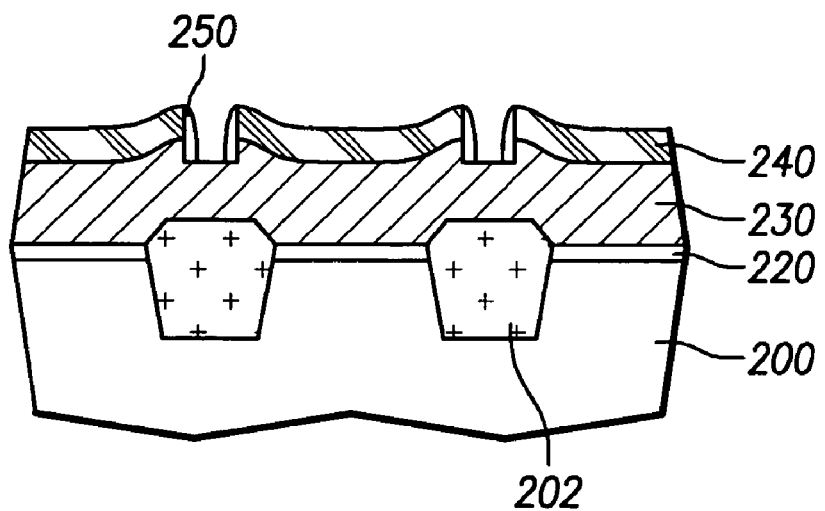

Thereafter, a second mask layer (typically comprising an insulator such as silicon dioxide, silicon oxynitride or silicon nitride, preferably the same material as the first mask layer [e.g., silicon nitride]) is deposited on the entire resultant structure. Typically, the thickness of the second mask layer is less than half (preferably from about 10% to about 35%) of the width of the mask pattern 242. Then the second silicon nitride layer is anisotropically etched to produce a sidewall spacer 250, as shown in FIG. 4C, on sidewalls of the partially etched polysilicon layer 230 as well as sidewalls of the patterned first silicon nitride layer 240.

Figure 4D:
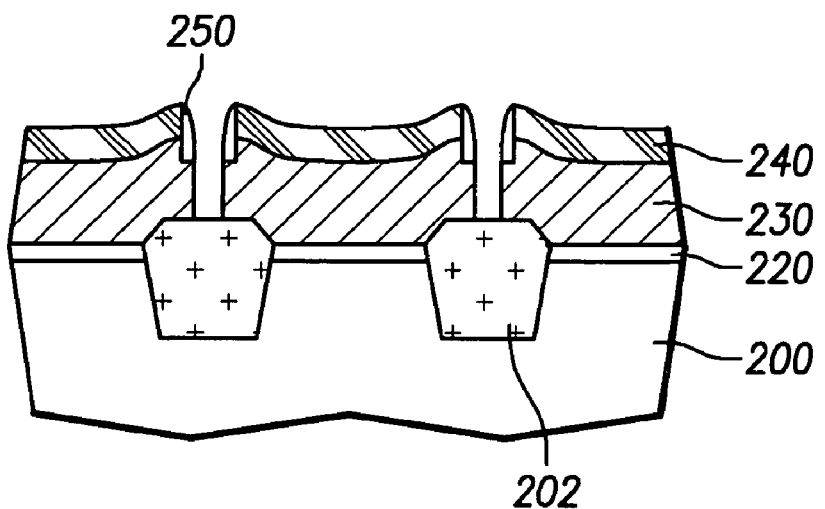

Referring to FIG. 4D, the partially etched polysilicon layer 230 is then fully etched using both the sidewall spacer 250 and the first mask (e.g., silicon nitride) layer 240 as a mask. The resulting polysilicon layer 230 is completely patterned, exposing a surface of the isolation region 202. Particularly, the polysilicon layer 230 maintains a partially etched shape (e.g., having a substantially horizontal surface substantially perpendicular to a sidewall of the polysilicon layer 230, and a substantially vertical surface substantially perpendicular to an uppermost surface of the polysilicon layer 230) at its top edge due to the sidewall spacer 250 during full etching.

A dry etching process may be preferably used for patterning the polysilicon layer 230. Furthermore, to compensate unwanted damage of the polysilicon layer 230 due to dry etching, a heat treatment process using oxygen gas may be carried out after the dry etching process. By such heat treatment, the top edge shape of the polysilicon layer 230 may become more fluent, rounded or stress- and/or strain-relieving.

Figure 4E:
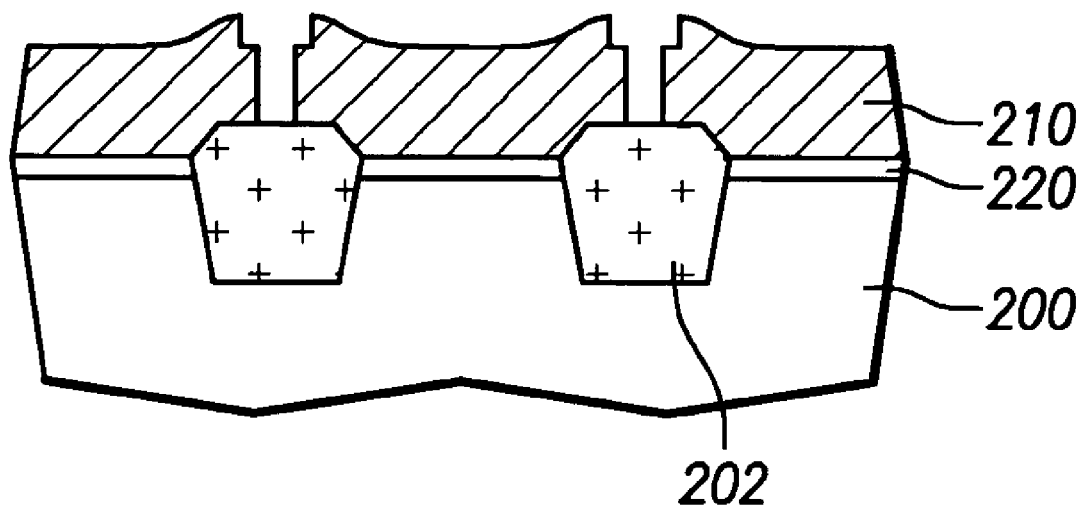

The mask layer 240 and the sidewall spacer 250 are then completely removed. For example, when the mask layer 240 and the sidewall spacer 250 each comprise silicon nitride, the mask layer 240 and the sidewall spacer 250 may be removed by using (e.g., treatment with) phosphoric acid. The resulting floating gate 210 is completed as shown in FIG. 4E. In particular, as discussed above, the top edge of the floating gate 210 has a near-round shape forming fluent curves. This near-round edge shape of the floating gate 210 prevents or lessens the concentration of electric field, so the reliability of the flash memory may be enhanced.

In addition, the present invention concerns a nonvolatile memory gate structure, comprising a semiconductor substrate having a plurality of isolation regions therein; a tunnel oxide layer thereon; and a gate layer thereover, having a partially etched shape at its top edge. Generally, the gate layer in the nonvolatile memory gate structure comprises a floating gate, but the invention may also be useful for a control gate (e.g., in a SONOS memory device, in which the floating gate comprises an oxide-nitride interface in an ONO dielectric layer, and the control gate comprises an overlying polysilicon layer).

The partially etched shape of the (floating) gate layer generally imparts lower stress and/or strain on an overlying dielectric. As shown particularly in FIG. 4E, the partially etched shape in the (floating) gate layer 210 may have (i) a substantially horizontal surface substantially perpendicular to a sidewall of the gate layer 210 and (ii) a substantially vertical surface substantially perpendicular to an uppermost surface of the gate layer 210. Generally, a height difference between the substantially horizontal surface of the partially etched shape and the uppermost surface of the gate layer 210 is from about 50% to about 95% of a thickness of the gate layer (i.e., 100% minus the depth of the partial polysilicon etch described with reference to FIG. 4B). Also, a distance between the substantially vertical surface of the partially etched shape and a sidewall of a gate layer 210 closest to the sidewall of an adjacent gate layer 210 is from about 10% to about 100% of a spacing between the two gate layer sidewalls (i.e., the closest gate layer sidewall and the adjacent gate layer sidewall.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of fabricating a floating gate for a nonvolatile memory, the method comprising:
   forming in sequence a tunnel oxide layer, a polysilicon layer, and a first mask layer on a semiconductor substrate having an isolation region;
   selectively etching the first mask layer to produce a mask pattern, and partially etching the polysilicon layer exposed through the mask pattern;
   forming a sidewall spacer on sidewalls of the partially etched polysilicon layer and the mask pattern;
   fully etching the polysilicon layer using both the sidewall spacer and the mask pattern as a mask, whereby the fully etched polysilicon layer has a partially etched shape at its top edge; and
   removing the mask pattern and the sidewall spacer such to form a floating gate.

2. The method of claim 1, further comprising: heat-treating the polysilicon layer after fully etching the polysilicon layer such that the top edge shape of the polysilicon layer changes.

3. The method of claim 1, wherein fully etching the polysilicon layer comprises a dry etching process.

4. The method of claim 3, further comprising:
   performing a heat treatment process in the presence of oxygen gas, after the dry etching process.

5. The method of claim 1, wherein forming the sidewall spacer includes depositing a second mask layer and then anisotropically etching the second mask layer.

6. The method of claim 5, wherein the first mask layer and the second mask layer each comprise silicon nitride.

7. The method of claim 1, wherein the mask pattern and the sidewall spacer each comprise silicon nitride.

8. The method of claim 7, wherein removing the mask pattern and the sidewall spacer comprises treating the mask pattern and the sidewall spacer with phosphoric acid.

9. The method of claim 1, wherein the floating gate imparts less stress and/or strain on an overlying dielectric with the partially etched shape than without and/or has stepped edge shape.

10. A method of fabricating a nonvolatile memory structure, comprising:
    selectively etching a first mask layer over a gate layer on a semiconductor substrate to produce a mask pattern;
    partially etching the gate layer exposed through the mask pattern;
    forming a sidewall spacer on sidewalls of the partially etched gate layer and the mask pattern;
    fully etching the gate layer exposed through the sidewall spacer and the mask pattern; and
    removing the mask pattern and the sidewall spacer to form the nonvolatile memory structure.

11. The method of claim 10, wherein the gate layer comprises polysilicon, and the semiconductor substrate has a plurality of isolation regions therein.

12. The method of claim 10, wherein the fully etched gate layer has a partially etched shape at its top edge.

13. The method of claim 10, wherein the nonvolatile memory structure comprises a floating gate, and a tunnel oxide layer is between the floating gate and the substrate.

14. The method of claim 13, wherein the floating gate imparts lower stress and/or strain on an overlying dielectric, and/or has a rounded edge shape.

15. A nonvolatile memory gate structure, comprising:
    a semiconductor substrate having a plurality of isolation regions therein;
    a tunnel oxide layer thereon; and
    a gate layer thereover, having a partially etched step shape exposed at its top edge by removing a mask pattern and a sidewall spacer.

16. The structure of claim 15, wherein the gate layer comprises a floating gate on the tunnel oxide layer.

17. The structure of claim 16, wherein the floating gate imparts less stress and/or strain on an overlying dielectric with the partially etched shape than without.

18. The structure of claim 15, wherein the partially etched shape has a substantially horizontal surface substantially perpendicular to a sidewall of the gate layer, and a substantially vertical surface substantially perpendicular to an uppermost surface of the gate layer.

19. The structure of claim 18, wherein a height difference between the substantially horizontal surface and the uppermost surface of the gate layer is from about 50% to about 95% of a thickness of the gate layer.

20. The structure of claim 18, wherein a distance between the substantially vertical surface and a gate layer sidewall closest to an adjacent gate layer sidewall is from about 10% to about 100% of a spacing between the closest gate layer sidewall and the adjacent gate layer sidewall.

* * * * *